United States Patent [19]

Tobin et al.

[11] Patent Number: 4,771,017

[45] Date of Patent: Sep. 13, 1988

[54] PATTERNING PROCESS

[75] Inventors: Stephen P. Tobin, Carlisle; Mark B. Spitzer, Lexington, both of Mass.

[73] Assignee: Spire Corporation, Bedford, Mass.

[21] Appl. No.: 65,572

[22] Filed: Jun. 23, 1987

[51] Int. Cl.⁴ .................... H01L 21/285; H01L 39/22
[52] U.S. Cl. .................................. 437/203; 437/192; 437/184; 437/194; 437/229; 437/944; 437/948; 437/245; 148/DIG. 143; 148/DIG. 137; 148/DIG. 106; 148/DIG. 104; 148/DIG. 100
[58] Field of Search ............... 437/203, 192, 194, 184, 437/229, 944, 948, 245; 148/DIG. 143, DIG. 137, DIG. 106, DIG. 104, DIG. 100

[56] References Cited

U.S. PATENT DOCUMENTS

| | | | |
|---|---|---|---|
| 3,898,353 | 8/1975 | Napoli et al. | 437/203 |
| 4,029,562 | 6/1977 | Feng et al. | 357/60 |
| 4,104,070 | 8/1978 | Moritz et al. | 96/36 |
| 4,145,459 | 3/1979 | Goel | 437/203 |
| 4,241,109 | 12/1980 | Johnson | 437/245 |
| 4,378,383 | 3/1983 | Moritz | 437/203 |
| 4,398,341 | 8/1983 | Geipel, Jr. et al. | 437/229 |
| 4,414,738 | 11/1983 | Jelks et al. | 437/245 |
| 4,450,033 | 5/1984 | Little | 156/380 |
| 4,525,919 | 7/1985 | Fabian | 437/245 |
| 4,536,942 | 8/1985 | Chao et al. | 437/80 |
| 4,539,222 | 9/1985 | Anderson, Jr. et al. | 437/229 |
| 4,599,790 | 7/1986 | Kim et al. | 148/DIG. 143 |
| 4,604,292 | 8/1986 | Evans et al. | 427/39 |

FOREIGN PATENT DOCUMENTS 0100432  6/1985 Japan .

OTHER PUBLICATIONS

"Photoresist Image Reversal for Better Slope Control," Microelectronic Mfg. & Testing, Aug. 1985, pp. 28-29.
Helmut Klose et al., "Image Reversal of Positive Photoresist: Characterization & Modeling," IEEE Transactions, V. Ed-32, No. 9, Sep. '85; pp. 1654–1661.
A. R. Shimkunas, "Advances in X-Ray Mask Technology," Solid State Technology/Sep. 1984; pp. 192–199.
Holger Moritz, "Optical Single Layer Lift-Off Process," IEEE Transactions v. Ed-32, No. 3, Mar. 1985, pp. 672–676.
J. F. Allisor et al., "Microlithographic Techniques for High Speed Gates FETS," Solid State Technology, Jun. 1986, pp. 169–175.
P. A. Iles, "A Survey of Grid Technology," 16th IEEE Photovoltaic Spec. Confr., Sep. 1982, pp. 340–347.
R. P. Jaeger et al., "Linewidth Control in X-Ray Lithography: the Influence of the Penumbral Shadow," SPIE vol. 471, pp. 110–120.
A. R. Shimkunas et al., "X-Ray Mask Technology," SPIE vol. 537, pp. 206–212.
G. E. Georgiou et al., "DC Electroplating of Sub-Micron Gold Patterns on X-Ray Masks," SPIE vol. 471, pp. 96–102.

(List continued on next page.)

Primary Examiner—Brian E. Hearn
Assistant Examiner—Beverly Ann Pawlikowski
Attorney, Agent, or Firm—Morse, Altman, Dacey & Benson

[57] ABSTRACT

An improved patterning process, useful for the metallization of highly efficient photovoltaic cells, the formation of X-ray lithography masks in the sub half-micron range, and in the fabrication of VLSI and MMIC devices, is disclosed. The improved patterning process includes the steps of providing a substrate with a photoactive layer, patterning the photoactive layer with an inclined profile, depositing on both the substrate and the patterned photoactive layer a layer of disjointed metal such that the thickness of the metal layer exceeds that of the patterned photoactive layer and that the metal layer deposited on the substrate is formed with walls normal to the surface of the substrate. Preferably, the deposition of the disjointed metal layer is effected by evaporative metallization in a direction normal to the surface of the substrate. The deposited metal layer on the substrate is characterized by a high aspect ratio, with a rectangular cross section.

11 Claims, 4 Drawing Sheets

OTHER PUBLICATIONS

J. G. Werker, "26% Efficient GaAs Concentrator Cells," *Sandia Report,* SAND85-0791/1, May 1985, pp. 160–164.

M. A. Green et al., "23.6% Efficient Low Resistivity Silicon Concentrator Solar Cell," *App. Phys. Lett.* 49(4) Jul. 28, 1986, pp. 194–195.

J. M. Gee et al., "A GaAs/Si Mechanically Stacked, Multijunction Solar Cell," 1985 IEEE, pp. 546–551.

R. A. Sinton et al., "27.5% Si Concentrator Solar Cells," IEEE, vol. Edl-7, No. 10, Oct. 1986, pp. 567–569.

M. J. O'3 Neill et al., "Two Entech Concentrator Modules: etc," *Sandia Report* SAND86-0058/1, pp. 173–182.

IBM Technical Disclosure Bulletin, "Image Reversal Lift-Off Process Using a Release Layer", vol. 29, No. 11, Apr. 1987, p. 4935.

PATTERNING PROCESS

BACKGROUND OF THE INVENTION

1. Field of the Invention

The present invention relates generally to patterning techniques and, more particularly, to an improved patterning process useful for the metallization of highly efficient photovoltaic cells, in the formation of X-ray lithography masks in the sub half-micron range, and in the fabrication of VLSI and MMIC devices.

2. The Prior Art

In the technology of today, the key words appear to be "speed," "effiiency" and "miniaturization". This is especially true in photovoltaics, in X-ray lithography and in electronic devices.

During the past decade or so, photovoltaic cells with conversion efficiencies of about 27% (AM1) have been achieved. These include single-crystal GaAs solar cells, in particular highly efficient GaAs concentrator cells, point-contact back junction cells and cascade photovoltaic cells. See U.S. Pat. No. 4,392,297, Little, "Process of Making Thin Film High Efficiency Solar Cells," assigned to a common assignee; J. G. Werthen, "26% Efficient GaAs Concentrator Cells," Rec. of the 13th Photovoltaic Concentrator Project Integration Meeting, *Sandia Report* SAND85-0791/1, 1985, p. 160; M. A. Green, M. Taouk, A. W. Blakers, S. Narayanan, J. Zhao, and P. Campbell, "23.6% Efficient Low Resistivity Silicon Concentrator Solar Cell," *Appl. Phys. Lett.* 49, 194 (1986); J. M. Gee, R. Y. Loo, S. S. Kameth, and R. C. Knechti, "A GaAs/Si Mechanically Stacked, Multi-junction Solar Cell," Rec. of the 18th *IEEE Photovoltaic Specialists Conference,* 1985; and R. M. Swanson, "Point-contact Solar Cells: Modeling and Experiment," *Solar Cells* 17, 85 (1986). A limiting factor in achieving higher conversion efficiencies in solar cells involves the losses experienced attendant on the metallization of the cells. These metallization losses prevent efficient operation at the high intensities (i.e., greater than 10 W/cm$^2$, equivalent to about 100 suns) at which the economic benefits of employing such highly efficient photovoltaic cells are realized.

Metallization of a solar cell must satisfy several conflicting requirements, such as: 1. the metal coverage of the front surface of the solar cell must be low in order to minimize losses due to the shadowing of the cell surface; 2. the distance from any point on the cell surface to the nearest metallization element must be short in order to minimize sheet resistance losses in the front surface layer; 3. resistance along the wire mesh and the conductor bus must be low; and 4. contact resistance between the metallization element and the semiconductor front surface must be low in order to minimize power losses due to these resistances. Thus, the total fraction of solar cell power lost is the sum of the fractional power losses due to sheet resistance, wire mesh and conductor bus resistances, and contact resistance, in addition to the above-mentioned shadowing.

Among these four, the principal power loss in a solar cell is optical shadow loss introduced by the front surface metallization. As known, a compromise exists between optical shadow loss and series resistance loss in the front contact, with the optical concentration design often determined accordingly. In general, these conflicting requirements are best satisfied by a metallic grid pattern comprising many fine, thin wires rather than fewer wider wires. This is particularly true for highly efficient solar cells, where narrow (about 3 microns) closely spaced (on about 30 to about 60 micron centers) lines are preferred. The power losses in a solar cell due to the several resistances and the shadowing can be derived from power criteria. With the aid of these criteria, the size and shape of the mesh can be optimized.

The fraction of power lost (Pshadow) in a solar cell due to the shadowing of the solar cell area is best expressed by the fractional cell area that is covered: Pshadow=$A_m/A_T$, where $A_m$ denotes the area of the metal and $A_T$ denotes the total area. In instances in which the wire grid lines are regularly spaced and are parallel, Pshadow is the ratio of the thickness of the wire "T" and the center-to-center spacing "W," with the fraction of power loss given by:

Pshadow=T/W,

The width of the open mesh element is determined by the wire spacing per cm and the thickness of the gridline wire.

The point-contact solar cell, described by R. M. Swanson in his article quoted above, is the only exception in that it has no optical shadow loss, due to its construction. However, if the point-contact solar cell is operated at high concentrations (at greater than 100 suns, i.e., at intensities in excess of 10 W/cm$^2$), precisely for which such a point-contact cell has been designed, its conversion efficiency becomes limited by series resistance in the back interdigitated collection grid. Thus, in the case of the point-contact solar cell, the design compromise is between series resistance and the necessary geometrical limitations imposed by the back junction interdigitated configuration.

In X-ray lithography and, in particular, in the formation of X-ray lithography masks in the sub half-micron range, it is imperative that the X-ray absorber walls be vertical so as to avoid penumbral shadow and thus to provide that degree of resolution and linewidth control necessary for making quality high-density electronic components and the like. X-ray lithography masks are required in X-ray lithography systems for making microcircuits, memories and other high-density electronic components. An X-ray lithography mask is a thin-film X-ray transparent membrane that is in tension and which has been patterned with an X-ray absorber material. The X-ray mask must be flat and possess good dimensional stability, tensile strength and tensile stress, and exhibit low defect densities, both when it is patterned and thereafter, in order to yield quality high-density electronic components. The adverse effects of nonvertical absorber walls on blur and linewidth control are described by R. P. Jaeger and B. L. Heflinger, in their article: "Linewidth Control in X-ray Lithography: the Influence of the Penumbral Shadow," *SPIE* 471, *Electron-Beam, X-ray, and Ion-Beam Techniques for Submicrometer Lithographies III* (1984), 110.

Basically, two methods in the art of X-ray lithography mask making have evolved: a "subtraction" method and an "additive" method. The subtraction method of X-ray lithography mask making essentially involves ion-etching through a patterned resist. The absorber wall profiles produced by the subtraction method, however, exhibit slopes which are off the vertical by 15 to 30 degrees. While such absorber wall profiles may have sufficed in the past for X-ray lithography purposes, they are clearly incompatible with sub half-micron X-ray lithography today. See A. R. Shimkunas and S. A. Harrell, "X-ray Mask Technology," *SPIE* 537, p. 206, 1985.

Workers at AT&T Bell Laboratories have gone the route of the additive method of X-ray lithography mask making in their efforts to obtain straight-walled half micron lines. In this additive method, the AT&T Bell workers have employed "fountain plating" through a straight-walled stencil. The formation of such a straight-walled stencil, however, requires a tri-level resist system to begin with. And, during the fountain plating itself through this straight-walled stencil, they noticed that they had to maintain careful control of the plating current so as to keep residual stress in the plated X-ray absorber walls near zero and also to maintain sub-micron grain size in those X-ray absorber walls. See G. E. Georgiou, C. A. Jankoski, T. A. Palumbo, "DC Electroplating of Sub-micron Gold Patterns on X-ray Masks," *SPIE* 471, p. 96, 1984. The commercial acceptance of their method, therefore, has yet to be proven.

The current state of affairs thus requires sub half-micron X-ray lithography masks with vertical X-ray absorber walls for the fabrication of reliable high-density electronic components, microcircuits, miniature memories and devices incorporating such components, microcircuits and memories. Such devices include the Very Large Scale Integration devices (VLSI), the ultra large scale integration devices (ULSI) and the Monolithic Microwave Integrated Circuits (MMIC), to mention but a few. The very quality and performance of these devices, so widely employed in our space exploration and defensive systems, depend in turn, on the quality of the fabrication methods employed during their manufacture.

SUMMARY OF THE INVENTION

It is a principal object of the present invention to overcome the above disadvantages by providing an improved patterning process for the metallization of highly efficient photovoltaic cells, for the formation of X-ray lithography masks in the sub half-micron range, and in the fabrication of VLSI and MMIC devices.

More specifically, it is an object of the present invention to provide an improved patterning process essentially comprising providing a substrate, depositing a photoactive compound resist layer thereon, patterning this resist layer with a pattern featuring inclined profiles, and depositing on both the substrate and the patterned resist layer, a layer of disjointed metal so that the thickness thereof exceeds the thickness of the resist layer and such that the metal deposited on the substrate is formed with walls normal to the surface of the substrate. Preferably, the deposition of the disjointed metal layer is effected by evaporative metallization and in a direction normal to the surface of the substrate. Preferably, the deposited metal layer on the substrate is characterized by a high aspect ratio and a rectangular cross section. For the formation of X-ray lithography masks in the sub half-micron range, a membrane first is provided on the substrate surface prior to depositing thereon the photoactive compound resist layer. Preferably, the photoactive compound resist layer is formed with anhydrous ammonia.

Other objects of the present invention will in part be obvious and will in part appear hereinafter.

The invention accordingly comprises the patterning process, and the product of that patterning process, of the present disclosure, its steps, components, parts and their interrelationships, the scope of which will be indicated in the appended claims.

BRIEF DESCRIPTION OF THE DRAWINGS

For a fuller understanding of the nature and objects of the present invention, reference is to be made to the following detailed description, which is to be taken in connection with the accompanying drawings, wherein.

DETAILED DESCRIPTION OF THE PREFERRED EMBODIMENTS

In general, the invention relates to an improved patterning process particularly useful for the metallization of highly efficient solar cells, in the formation of X-ray lithography masks in the sub half-micron range and, in the fabrication of ULSI, VLSI and MMIC devices.

High efficiency solar cells include GaAs concentrator cells, point-contact back junction cells and cascade photovoltaic cells. These high efficiency solar cells are designed for operation at high intensities so as to derive their inherent economic benefits. By high intensities, it is meant to define intensities exceeding about 100 suns, i.e., exceeding 10 W/cm$^2$. The principal power loss in solar cells and, in particular, in high efficiency solar cells, is occasioned by optical shadow loss due to the front contact. Such optical shadow loss must be compromised with other losses occurring in the solar cell, most notably, series resistance loss.

Figure 1:
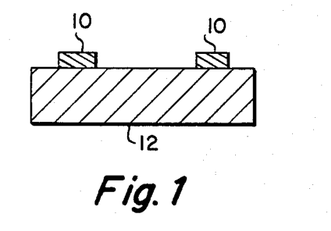
FIG. 1 is a schematic sectional view of a wafer with a typical metallization.

A typical front contact 10 formed on a semiconductor wafer 12, formed of a group including single crystal silicon, amorphous silicon, gallium arsenide, indium phosphide, aluminum gallium arsenide, gallium arsenide phosphide, gallium indium arsenide, gallium phosphide, gallium antimonide, and related alloys is illustrated in schematic section in FIG. 1. The front contact 10 may be formed on the front surface of the wafer 12 by any known method. One such preferred method is disclosed in U.S. Pat. No. 4,450,033 granted on May 22, 1984 to Spire Corporation of Bedford, Mass., the common assignee herein, the disclosure of which is incorporated herein by reference. Such a typical front contact 10 is characterized by a low aspect ratio, that is a low height of the front contact 10 relative to its width, with its cross section being rectangular. The efficiency of the illustrated front contact 10, and hence the resultant solar cell, can be materially enhanced by reducing the optical shadow loss introduced by this typical front contact 10. The optical shadow loss thereof is reduced by increasing its aspect ratio (i.e., the height of the contact 10 over its width) to at least unity (i.e., square cross section), and preferably to better than unity, approaching an ideal aspect ratio of at least about 2 to 1. The ideal ratio, of course, depends on the particular cell design, and is further determined by design analysis. For example, the ideal ratio can involve, inter alia, a trade-off between obtaining low enough resistance to the current generated under a particular set of light concentration conditions and the cost of the metal. Increasing the aspect ratio of the front contact 10, increases the conversion efficiency by decreasing the series resistance.

Figure 2:
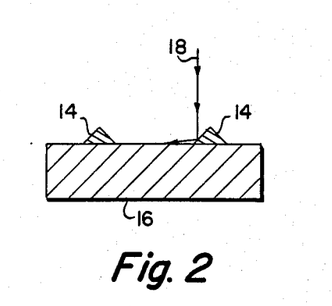
FIG. 2 is a view similar to FIG. 1 but showing a desired shape of metallization with low shadow loss.

In FIG. 2 is illustrated an improved shape, e.g., triangular, for a front contact 14 on a wafer 16, at least from the point of view of offering very low optical shadow loss. Note the reflection of radiation 18 onto the wafer surface by the triangularly shaped front contact 14. The triangular shape of the front contact 10 does very little, if anything, to decrease the series resistance of the resultant solar cell, however.

Figure 3:
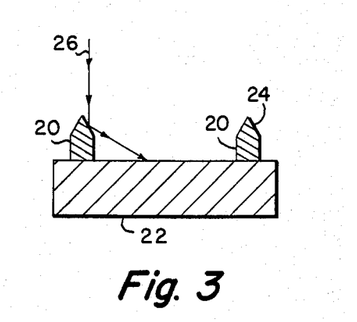
FIG. 3 is also a view similar to FIG. 1 but showing a type of metallization yielding both low shadow loss and low series resistance.

The ideal shape for a front metal contact 20 on the front surface of a semiconductor wafer 22 is illustrated in FIG. 3. The cross section of this ideal front contact 20 combines both a high aspect ratio of about 2 to 1, topped off by a triangular shape 24 over the rectangular lower portion thereof, substantially as shown. Such a hybrid front contact 20 for a solar cell yields both a low optical shadow loss (note the reflection of radiation 26 onto the wafer surface) as well as low series resistance due to finer grid lines. One object of the invention resides in approaching such an ideal cross section in the formation of front contacts for highly efficient solar cells.

Figure 4:
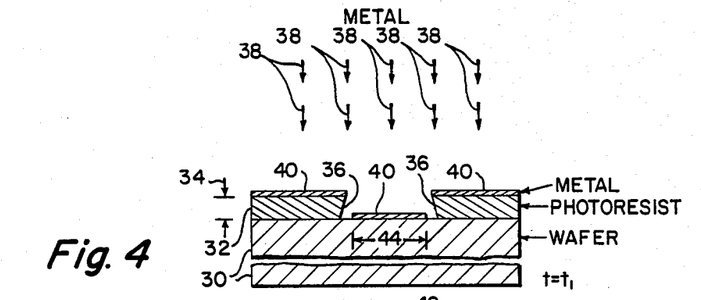
FIG. 4 is a schematic representation of the patterning process of the invention as it applies to photovoltaics at time $t_1$.
Figure 5:
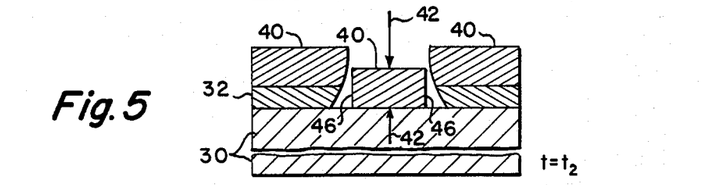
FIG. 5 is a view similar to FIG. 4 but illustrating the patterning process at time $t_2$.
Figure 6:
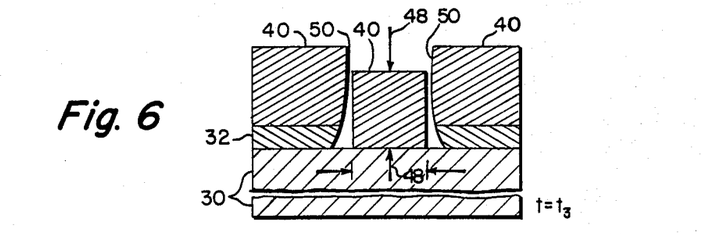
FIG. 6 is a view similar to FIG. 4 but illustrating the patterning process at $t_3$.

In FIGS. 4-6 is illustrated, schematically, the improved patterning process of the invention as it applies to the formation of front (or back) metallic contacts onto a surface of a semiconductor wafer 30. The objective herein is to achieve a front contact that is characterized by a high aspect ratio exceeding unity and, preferably being about 2 to 1, and in which the front contact is formed with side walls being normal to the surface of the wafer 30. The result is a patterned metallization with a rectangular cross section, yielding reduced grid line series resistance without increased optical shadow loss, due to increased radiation reflection into the wafer 30 from off the high walls of the metallization.

The patterning process is illustrated at time=$t_1$ in FIG. 4, at time=$t_2$ in FIG. 5, and at time=$t_3$ in FIG. 6. The semiconductor wafer 30 is shown being provided with a photoactive compound layer 32 of a predetermined thickness 34, indicated between the opposed arrows. This predetermined thickness 34 of the photoactive compound layer 32 varies between a range of 1 to 10 micrometers, and preferably is about 3 micrometers. The photoactive compound layer 32 (i.e., the photoresist) preferably is formed with the aid of anhydrous ammonia gas so as to be patterned with inclined profiles 36, preferably in an image reversal process. One such photoresist image reversal process is disclosed by the Yield Engineering Systems, Inc. of Sunnyvale, Calif., see *Microelectric Manufacturing and Testing,* August 1985, pages 28-29. A similar process is described by workers from Siemens A. G., of Munich, West Germany, see Helmet Klose et al., "Image Reversal of Positive Photoresist: Characterization and Modeling," *IEEE Transactions on Electron Devices,* Vol. Ed-32, No. 9, September 1985.

As stated in these articles, a distinctive feature of the image reversal of positive photoresist is the possibility of controlling the angle of inclination of the inclined profiles 36. This angle of inclination of the inclined profiles 36 in the image reversal process of forming and patterning the photoactive compound layer 32 is controlled, primarily, by proper adjustment of both the patterning and the flood exposure doses. These respective exposure doses are, in turn, controlled by adjustment of the respective power densities ($W/cm^2$) of incident light and the time frames during which the photoactive compound layer 32 is exposed to such incident light.

With the photoactive compound layer 32 properly patterned with the inclined profiles 36 on the semiconductor wafer 30, the same is exposed to metallization, as indicated by the arrows 38 in FIG. 4. This metallization step preferably is carried out by evaporative metallization and in such a way that the metal is evaporated onto the wafer surface 30 at an incidence angle normal to the wafer surface. As a consequence of the inclined profiles 36 of the patterned photoactive compound layer 32 (the photoresist), a layer 40 of disjointed metal is deposited on both the photoactive compound layer 32 and the surface of the wafer 30 in the opening between the inclined profiles 36. By the layer 40 being disjointed is meant to define the absence of any connecting bridging between the deposited metal on top of the photoactive compound layer 32 and the deposited metal on top of the wafer surface. Due to this absence of any connecting bridging, the lift-off of the photoactive compound layer 32, together with the deposited metal layer 40 thereon, is facilitated so as to leave only the metal layer 40 deposited directly on the surface of the wafer 30, to serve as the front (or back, as the case may be) contact.

Since the amount of metal deposited in the layer 40 is constant, being dependent only on the time duration of the metallization step, the thickness of the deposited metal layer 40 on top of the photoconduction layer 32 will, at any given time, equal the thickness of the deposited metal layer 40 directly on top of this surface of the wafer 30. At time $t_1$ (between about 1.0 to 15 minutes), illustrated in FIG. 4, the thickness of the deposited metal layer 40 is about 0.6 micrometers, depending on the rate of deposition. At time $t_2$ (between about 15 to 150 minutes into the metal deposition process), illustrated in FIG. 5, the thickness of the deposited metal layer 40 in between the arrows 42 has grown to about 6 micrometers, on its way to approaching an aspect ratio of unity, i.e., its thickness almost equals its width 44, indicated in FIG. 5. Thus, the cross section of the metal layer 40 deposited directly onto the wafer surface is rectangular and approaching to being square. It must be pointed out that the side walls 46 of the deposited metal 40 on the wafer surface are formed substantially normal to the wafer surface.

At time t₃ into the metallization process (about 5 hours), illustrated in FIG. 6, the thickness of the deposited metal layer 40 in between the arrows 48 has grown to about twelve micrometers, with an aspect ratio exceeding unity and approaching about 2 to 1. It will be observed that the top of the metal layer 40 deposited directly onto the wafer surface in between the inclined profiles 36 of the photoactive compound layer 32 will always be lower than the top of the metal layer 40 deposited onto the photoactive compound layer 32 by the thickness of the photoactive compound layer 32, as indicated in between the arrows 34.

As a practical matter, the metallization step cannot proceed indefinitely since, with time, a narrowing occurs between the edges 50 of the deposited metal layer 40 as the metallization prgresses. This narrowing of the gap between the opposed edges 50 of the deposited metal layer 40 is the result of some deposited metal adhering to these edges 50 during the deposition. We have found that an aspect ratio of about 2 to 1 is about what can be achieved as regards the cross section of the deposited metal layer 40 directly onto the wafer surface in between the edges 50.

Preferably, and depending on end use, the deposited layer 40 of disjointed metal is formed of one or more of a group including gold, silver, aluminum, tungsten, hafnium, chromium, titanium, platinum, palladium, nickel, tin and their respective alloys.

Figure 7:
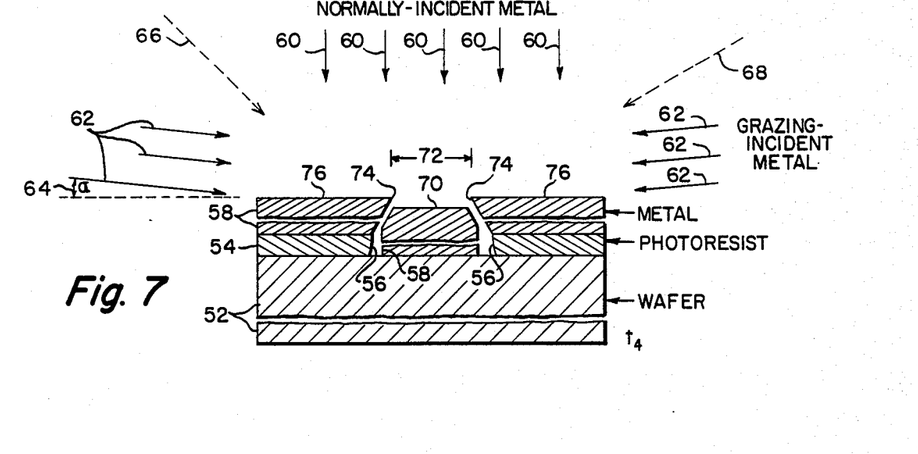
FIG. 7 is also a view similar to FIG. 4 but illustrating a modified patterning process of the invention at time $t_4$.
Figure 8:
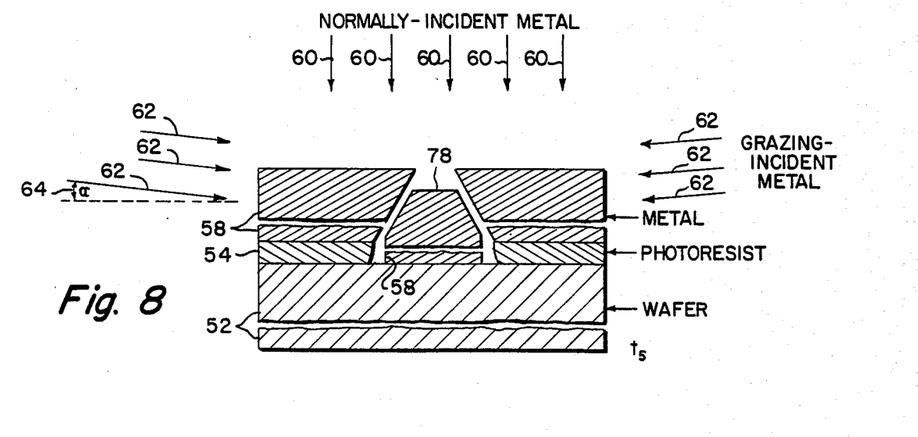
FIG. 8 is a view similar to FIG. 7 but illustrating the patterning process at time $t_5$.

In FIGS. 7 and 8, a modified patterning process according to the invention is illustrated. This modified patterning process is designed to achieve a front contact metallization on semiconductor wafers that approximates the ideal shape thereof, illustrated in and described with reference to in FIG. 3, as nearly possible. This modified patterning process in effect starts where the patterning process shown in and described with reference to FIGS. 4–5 has left off. A semiconductor wafer 52 is provided with a photoactive compound layer 54, which is duly patterned with inclined profiles 56. A disjointed layer of metal 58 is then first deposited, on both the photoactive compound layer 54 and on the wafer surface in the gap between the inclined profiles 56, by metal evaporated at an incidence angle normal to the wafer surface, as indicated by the arrows 60. This vertical metal evaporation step is persisted in as long as the metal deposited on the wafer surface has achieved a desired aspect ratio, which may be approaching unity, as illustrated in FIG. 5, or being at unity, or exceeding unity, as illustrated in FIG. 6, or preferably having an aspect ratio of about 2 to 1. It is understood that, during this initial vertical metal evaporation step, the side walls of the layer 58 of metal deposited directly on the surface of the wafer 52 are being formed substantially normal to the wafer surface, for the reasons advanced above in describing the process with respect to the FIGS. 4–6.

Once the desired aspect ratio has been achieved in this first vertical metal evaporation step, a second but contiguous metal evaporation from a multisource deposition is initiated. This multisource deposition of metal is illustrated in FIGS. 7 and 8. In addition to, and simultaneously with, vertical metal evaporation, indicated by the arrows 60, metal also is now being evaporated at grazing incidence, as indicated by the arrows 62, and at an angle 64. The grazing incidence angle 64 is between a range of 0.1° to 20°, and is preferably about 5°. Furthermore, at the very beginning of this multisource metal deposition by evaporation, it is envisaged that a higher grazing angle be employed for a short period of time, as illustrated by the arrow 66 in dashed lines, followed by a shallower grazing angle, as illustrated by the arrow 68, also in dashed lines, for another short period of time, until the preferred grazing angle 64 is assumed in the process. The objective, of course, is to achieve triangular metallization 70 on top of the initial vertical-walled layer 58. Such triangular metallization 70 is achieved by the combined effects of the multisource evaporation metallization, effecting a progressive internal narrowing of the gap 72 between the edges 74 of the metal layer 76 deposited on top of the photoactive compound layer 54. This intentional narrowing of the gap 72 is proceeding at a much faster rate than is the unintentional narrowing of the gap described above re the process illustrated in FIGS. 4–6.

Due to the evaporation of metal from a multisource configuration, progressively more and more metal adheres at the edges 74, resulting in progressive narrowing of the gap 72. This has the consequence of effecting a gradual triangular metallization 70, with an ever narrower top 78, as the process continues. As a practical matter, this top 78 will always be of some width since the triangular metallization step must be terminated before the complete closing of the gap 72 between the edges 74. This is chieved near the end of the time period t₅, illustrated in FIG. 8, which combined with the time period t₄ of FIG. 7, ranges from about fifty minutes to about five hours. The time of effecting the triangular metallization 70 is, of course, influenced not only by the particular metal or metal-alloy used, but also and more importantly by the number of sources and the rates of deposition from those sources employed for the evaporation of metal at the grazing incidence, or incidences as indicated by the arrows 62, 66 and 68, as well as by the respective incidence angles thereof.

Figure 9:
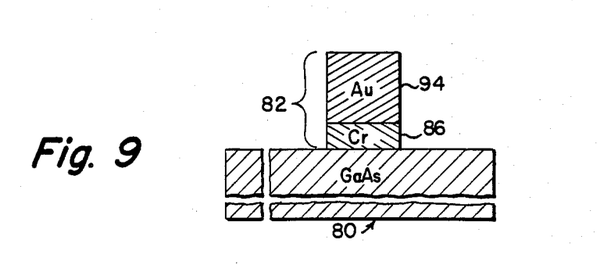
FIG. 9 is a schematic illustration of the contact configuration of a GaAs solar cell.

In FIG. 9 is illustrated a GaAs solar cell 80 with a multiple layer metallization system 82 effected by a metallization process described with reference to FIGS. 4–6. The metallization system 82 is characterized by a rectangular cross-section with an aspect ratio exceeding unity and approaching about 2 to 1, and with side walls that have been formed nearly normal to the surface of the GaAs wafer, so as to achieve a low optical shadow loss in the solar cell 80.

The herein illustrated multiple layer metallization system 82 comprises a chromium ohmic contact layer 86, upon which is formed a conducting layer 94 formed of gold. While the specific illustrated multiple layer metallization system 82 is of particular application to GaAs solar cells of high conversion efficiency, being about 25% at high intensities, other multiple layer metallization systems will equally well suggest themselves to those skilled in the art. Their deposition is, of course, effected by successively changing the identity of the evaporative metal from the single source normal to the wafer surface.

The current voltage (I-V) characteristics of a typical solar cell are more fully described and illustrated in the U.S. Pat. No. 4,450,033 mentioned above, whose disclosure has been incorporated herein by reference.

Figure 10:
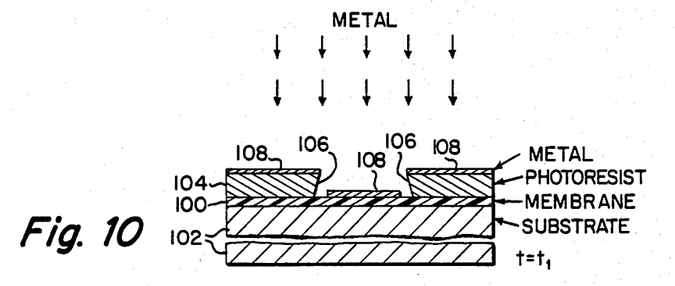
FIG. 10 is a schematic representation of the patterning process of the invention as it applies to the making of X-ray lithography masks for ULSI, VLSI and MMIC devices at time $t_1$.
Figure 11:
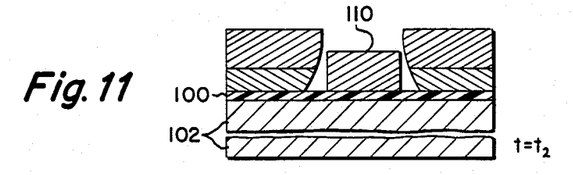
FIG. 11 is a view similar to FIG. 10 but showing the patterning process at time $t_2$.
Figure 12:
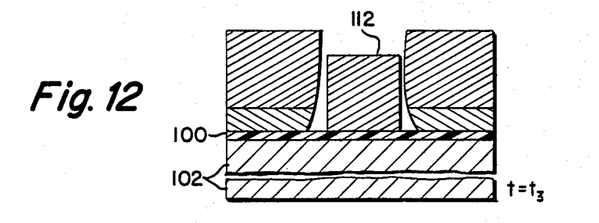
FIG. 12 is a view also similar to FIG. 10 but showing the patterning process at time $t_3$.

In FIGS. 10–12 is illustrated a patterning process according to the invention as it applies to the making of X-ray lithography masks in the sub half-micron range for ULSI, VLSI and MMIC devices. The process is basically the same as shown in and described with reference to FIGS. 4-6, except for first providing a membrane 100 on a semiconductor substrate 102, before depositing thereon and patterning a photoactive layer 104 with inclined profiles 106. An X-ray mask blank process and the use of X-ray masks in general in X-ray lithography systems is more fully disclosed in U.S. Pat. No. 4,604,292, also granted to the Spire Corporation of Bedford, Mass., the common assignee, on Aug. 5, 1986, the disclosure of which also is incorporated herein by reference.

The requirements of X-ray lithography masks in the sub half-micron range, and the adverse effects of non-vertical absorber walls on blur and linewidth control already have been discussed above.

Thereafter, the patterning process in FIGS. 10-12 proceeds just like in the process of FIGS. 4-6, by the deposition of a layer 108 of disjointed metal on both the photoactive compound layer 104 and the membrane 100 in the gap between the inclined profiles 106. This deposition of the metal layer 108 also is preferably effected by evaporative metallization from a single source above the substrate 102 and at an incidence angle normal to the surface of the substrate 102 and the thereon formed membrane 100. As illustrated in FIGS. 11 and 12, the evaporative metallization step is persisted in for time periods $t_2$ and/or $t_3$, until such time that the desired aspect ratio for the deposited metallization on top of the membrane's surface has been achieved. Such time frames for $t_2$ and $t_3$ are between the ranges of about 0.5 to 5 minutes, and preferably are 1 minute, and 2 minutes, respectively. Lift-off of the photoactive compound layer 104 and the thereon deposited metal layer 108 is effected in the same way as above, leaving a membrane 100 metallized, as at 110 or 112, illustrated in FIG. 11 or FIG. 12, respectively. It is pointed out that these metallizations 110 and/or 112 also are with side walls that extend substantially normal to the surface of the membrane 100.

Figure 13:
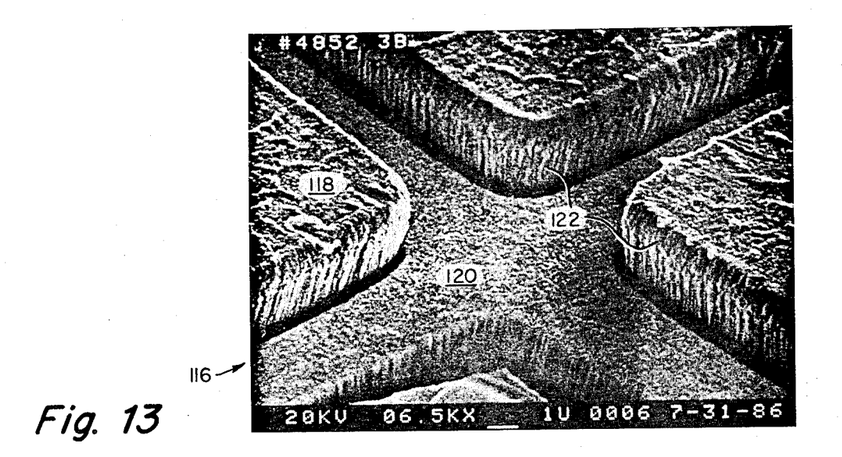
FIG. 13 is a perspective of a scanning electron micrograph of a patterned wafer with a layer of deposited disjointed metal shown thereon.

In FIG. 13 is shown, in perspective and on a greatly enlarged scale a scanning electron micrograph (S.E.M.) 116 of a patterned wafer with a layer 118 and a layer 120 of disjointed metal shown thereon. The metal layer 118 is shown deposited on top of the photoactive compound layer, while the metal layer 120 is shown deposited directly on top of the underlying wafer surface in between the gaps formed by the inclined profiles 122. As can be clearly seen, there is no bridging between the metal layer 118 on the photoactive compound layer and the metal layer 120 on the wafer surface.

Figure 14:
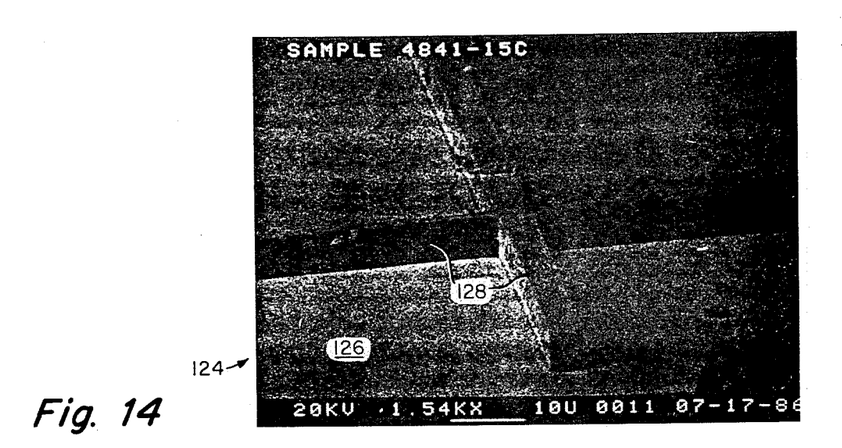
FIG. 14 is a perspective view of the metallized surface of a wafer according to the invention.
Figure 15:
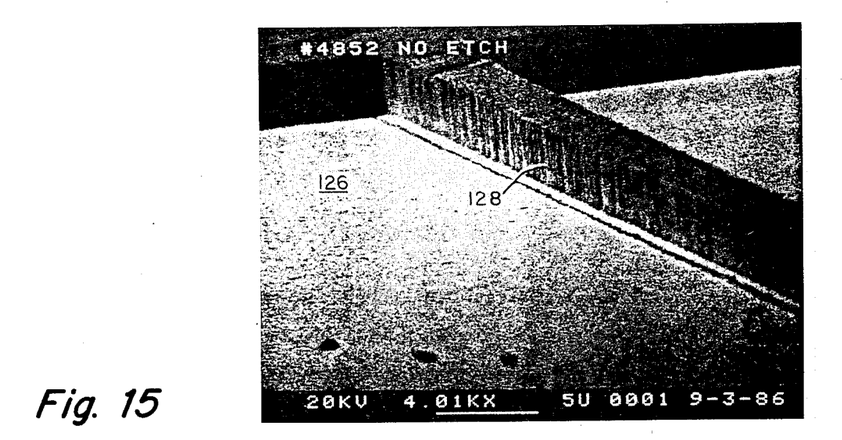
FIG. 15 is an enlarged fragmentary view of the metallized wafer surface of FIG. 14.

FIG. 14 illustrates, in perspective and on an enlarged scale, an S.E.M. 124 of a fragmentary metallized surface of a GaAs wafer 126 patterned according to the process of the invention. The contact grid line 128, formed on the surface of the GaAs wafer 126, after lift-off of the photoactive compound layer together with the layer of disjointed metal thereon, shows that the grid line 128 has an approximately square cross section with an aspect ratio of about unity, and with side walls formed normal to the surface of the wafer 126. FIG. 15 is an enlarged fragmentary view of the metallized surface of the GaAs wafer 126, to provide a closer view thereof.

Thus it has been shown and described an improved patterning process useful for the metallization of high efficiency photovoltaic cells, the formation of X-ray lithography masks in the sub half-micron range, and in the fabrication of ULSI, VLSI and MMIC devices, which patterning process satisfies the objects and advantages set forth above.

Since certain changes may be made in the present disclosure without departing from the scope of the present invention, it is intended that all matter described in the foregoing specification or shown in the accompanying drawings, be interpreted in an illustrative and not in a limiting sense.

What is claimed is:

1. In a patterning process of the kind comprising:
   (a) providing a substrate;
   (b) providing a photoactive compound layer on said substrate; and
   (c) patterning said layer with an inclined profile; the improvement comprising depositing on both said substrate and said patterned photoactive compound layer a layer of disjointed metal in which the thickness of said deposited metal layer exceeds the thickness of said photoactive compound layer;
   (d) said depositing of said disjointed metal layer being effected first in a direction normal to the surface of said substrate until an apsect ratio approaching unity is achieved, followed by a multisource deposition from both a direction normal to said surface and also at an angle thereto;
   (e) said layer of metal deposited on said substrate being formed with an aspect ratio exceeding unity;
   (f) said angle of said multisource deposition being an incidence angle between a range from about 0.1° to about 20°.

2. In the patterning process of claim 1 wherein said multisource deposition at said angle includes a progressively shallower grazing angle and wherein said metal is one or more of a group including gold, silver, aluminum, tungsten, hafnium, chromium, titanium, platinum, palladium, nickel, tin, and their respective alloys, and wherein said substrate is a semiconductor wafer formed of a group including silicon, amorphous silicon, gallium arsenide, indium phosphide, aluminum gallium arsenide, gallium arsenide phosphide, gallium indium arsenide, gallium phosphide gallium antimodie and related alloys.

3. In the patterning process of claim 1 wherein said aspect ration is about 2 to 1, and wherein said layer of metal deposited on said substrate is formed with walls normal to said substrate surface proximal thereto and with walls at an angle to said substrate surface distal thereto.

4. In the patterning process of claim 1 wherein said layer of metal deposited on said substrate has a width within a range of about 2-20 microns and a height within a range of about 4-40 microns.

5. In the patterning process of claim 2 wherein said semiconductor wafer is a highly efficient photovoltaic cell, such as a cascade cell, a point-contact cell or a gallium arsenide concentrator cell.

6. In the patterning process of claim 2 wherein said layer of metal deposited on said substrate is a metallization system comprising an ohmic contact and a conductor layer secured thereto, and wherein said metallization system covers at least a bout 10% of the surface of said substrate.

7. In a patterning process of the kind comprising:
   (a) providing a substrate;
   (b) providing a photoactive compound layer on said substrate;
   (c) patterning said layer with an inclined profile; the improvement comprising depositing on both said substrate and said patterned photoactive compound layer a layer of disjointed metal in which the thickness of said deposited metal layer exceeds the thickness of said photoactive compound layer and said layer of metal deposited on said substrate is formed with walls normal to the surface of said substrate;

(d) said layer of metal deposited on said substrate being formed with an aspect ratio of about 2 to 1; and (e) providing a membrane on said substrate prior to providing said photoactive compound layer thereon.

8. In the patterning process of claim 7 wherein said layer of metal deposited on said membrane on top of said substrate has a width within a range of about 0.2 microns to about 0.55 microns and a height within a range of about 0.5 microns to about 1.0 microns, and wherein said membrane is one of a group including hydrogenated boron nitrite, silicon carbide, aluminum oxide, beryllium and silicon oxide, and radiation-resistant non-hydrogenerated films deposited by ion beam techniques.

9. In the patterning process of claim 7 wherein said photoactive compound layer is formed with anhydrous ammonia, and wherein said metal has a submicron grain size.

10. In the patterning process of claim 7 wherein said layer of disjointed metal possesses a tensile stress not exceeding about $3 \times 10^8$ dynes/cm$^2$.

11. In the patterning process of claim 7 wherein the product of said process exhibits a defect density of no more than two printable defects per 0.1 cm$^2$.

* * * * *

UNITED STATES PATENT AND TRADEMARK OFFICE
CERTIFICATE OF CORRECTION

PATENT NO. : 4,771,017

DATED : September 13, 1988

INVENTOR(S) : Stephen P. Tobin and Mark B. Spitzer

It is certified that error appears in the above-identified patent and that said Letters Patent is hereby corrected as shown below:

In column 1, line 3, before

"Background of the Invention"   insert

-- The United States Government has rights in this invention pursuant to Contract No. DE-AC04-76DP00789 (Subcontract No. 04-6098) between the United States Department of Energy and Spire Corporation. --

Signed and Sealed this

Twenty-fourth Day of April, 1990

Attest:

HARRY F. MANBECK, JR.

*Attesting Officer*     *Commissioner of Patents and Trademarks*